(12) United States Patent
Wang

(10) Patent No.: US 8,551,290 B2
(45) Date of Patent: Oct. 8, 2013

(54) APPARATUS FOR SUBSTRATE PROCESSING WITH FLUID

(75) Inventor: Yi-Cheng Wang, Hsinchu (TW)

(73) Assignees: Perfect Dynasty Taiwan Ltd., Hsinchu (TW); Wang Yi-Cheng, Hsinchu (TW)

( * ) Notice: Subject to any disclaimer, the term of this patent is extended or adjusted under 35 U.S.C. 154(b) by 873 days.

(21) Appl. No.: 12/243,254

(22) Filed: Oct. 1, 2008

(65) Prior Publication Data

US 2009/0045034 A1 Feb. 19, 2009

Related U.S. Application Data

(63) Continuation-in-part of application No. 11/342,550, filed on Jan. 31, 2006, now abandoned.

(51) Int. Cl.
*B65G 47/22* (2006.01)

(52) U.S. Cl.
USPC ...................... 156/345.55; 198/493

(58) Field of Classification Search
USPC ............... 156/345, 345.1, 345.22, 345.55; 118/728, 730, 500; 414/416.01; 206/832; 198/493
See application file for complete search history.

(56) References Cited

U.S. PATENT DOCUMENTS

| | | | | |
|---|---|---|---|---|
| 4,738,748 A | * | 4/1988 | Kisa | 438/727 |
| RE32,684 E | * | 5/1988 | Lenhart | 118/500 |
| 6,261,407 B1 | * | 7/2001 | Treichel et al. | 156/345.3 |
| 2003/0073309 A1 | * | 4/2003 | Emami | 438/689 |
| 2005/0051101 A1 | * | 3/2005 | Kuznetsov et al. | 118/728 |
| 2009/0045034 A1 | * | 2/2009 | Wang | 198/493 |

* cited by examiner

*Primary Examiner* — Sylvia R MacArthur
(74) *Attorney, Agent, or Firm* — Chun-Ming Shih; HLDS IPR Services

(57) ABSTRACT

An apparatus for substrate processing, mainly includes a processing unit and a fluid supply unit. The processing unit includes a platform for laying a substrate. The platform includes a plurality of injection holes defined thereon, the injection holes obliquely and downwardly extend from a top surface of the platform. The fluid supply unit includes a plurality of containers containing fluids for supplying to the processing unit and fluid-connected to the injection holes of the platform. The fluids from the fluid supply unit can be obliquely injected out from the injection holes and slightly floats and moves the substrate over the platform and reacts with the substrate.

9 Claims, 10 Drawing Sheets

APPARATUS FOR SUBSTRATE PROCESSING WITH FLUID

This application is a continuation-in-part of U.S. patent application Ser. No. 11/342,550, filed Jan. 31, 2006 now abandoned.

BACKGROUND OF THE INVENTION

1. Field of the Invention

The present invention generally relates to an apparatus and a method for substrate processing, and more specifically to an apparatus and a method for a substrate processing with the movement of a substrate powered by fluid. The present invention is applicable to a substrate processing for chemical cleaning, etching, drying, surface processing, and other special substrate processing.

2. Description of Related Art

Conventional substrate processing usually need to move the substrate through a sequence of processing steps, such as cleaning, etching, electroplating, drying, heating, chilling, diffusing, curing, and so on. Many conventional substrate processing apparatuses use motors and drive mechanisms to provide power required for conveying or rotating the substrate.

FIG. 1 shows a schematic view of a conventional manufacturing system, which including a processing unit 110, a fluid supply unit 120 and a power supply unit 130. The processing unit 110 includes a rotating platform 111 and a sink 112. A substrate 140 is placed on the rotating platform 111 for processing. The fluid supply unit 120 is connected to a plurality of chambers 121 containing chemical fluids required for substrate processing. The chemical fluid is supplied through fluid supply unit 120 to react with a top surface of the substrate 140 on the rotating platform 111, and then flows into the sink 112 after the reaction process. The power supply unit 130 includes a motor 131 and a drive shaft 132, which provide power to rotate the rotating platform 111.

A drawback of the above conventional manufacturing system is that the presence of the power supply unit 130 makes the substrate processing apparatus much bulkier, and hence difficult to stack another same one on the processing unit 110 to save space. In addition, the power supply unit 130 also increases the cost to the substrate processing apparatus. It is therefore imperative to provide a substrate processing system that can improve the power supply mechanism to increase the substrate processing efficiency.

SUMMARY OF THE INVENTION

The present invention has been made to overcome the above-mentioned drawback of conventional manufacturing systems that use a motor power supply unit. The object of the present invention is to provide a apparatus that uses the fluid to provide the power to move the substrate through the manufacturing process.

Yet another object is to provide a manufacturing system and a method that is simple in structure and inexpensive in manufacturing.

To achieve the aforementioned objects, the present invention provides an apparatus for substrate processing with fluid. The apparatus mainly includes a processing unit and a fluid supply unit. The processing unit includes a platform for laying a substrate, the platform comprising a plurality of injection holes defined thereon, the injection holes obliquely and downwardly extend from a top surface of the platform. The fluid supply unit includes a plurality of containers containing fluids for supplying to the processing unit and fluid-connected to the injection holes of the platform. The fluids from the fluid supply unit can be obliquely injected out from the injection holes and slightly floats and moves the substrate over the platform and reacts with the substrate.

The foregoing and other objects, features, aspects and advantages of the present invention will become better understood from a careful reading of a detailed description provided herein below with appropriate reference to the accompanying drawings.

BRIEF DESCRIPTION OF DRAWING

The present invention can be understood in more detail by reading the subsequent detailed description in conjunction with the examples and references made to the accompanying drawings, wherein.

DETAILED DESCRIPTION OF THE INVENTION

Figure 1:
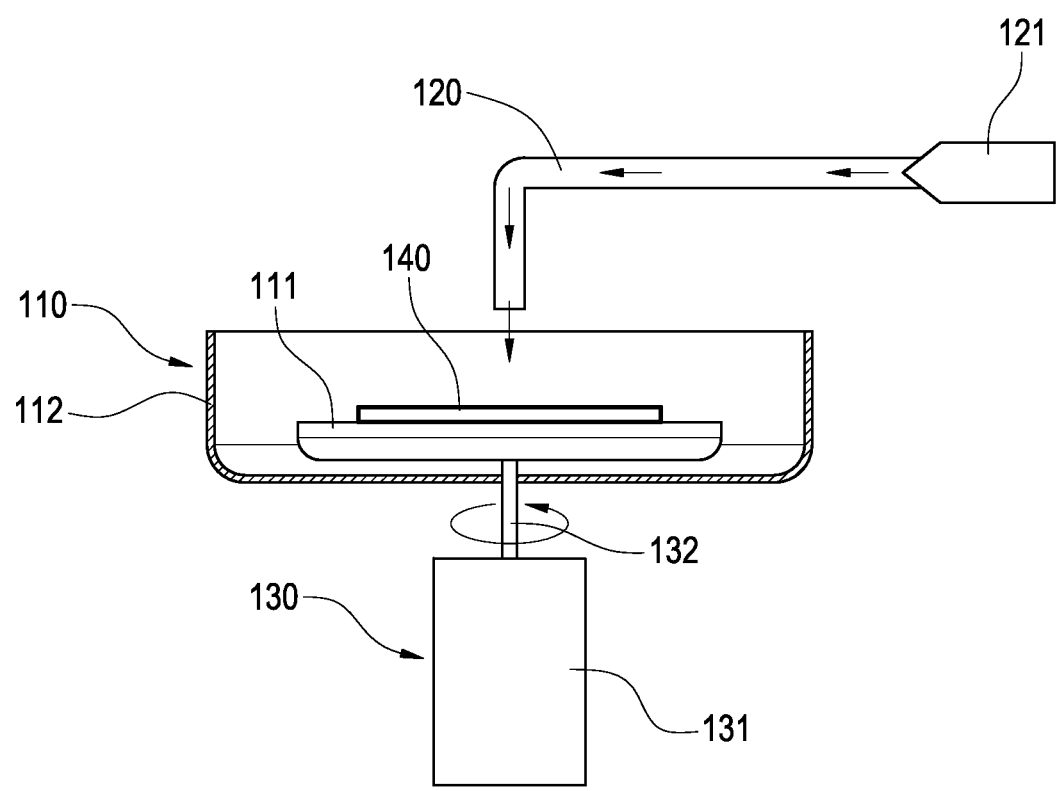
FIG. 1 shows a schematic view of a conventional motor-driven substrate processing apparatus.
Figure 2:
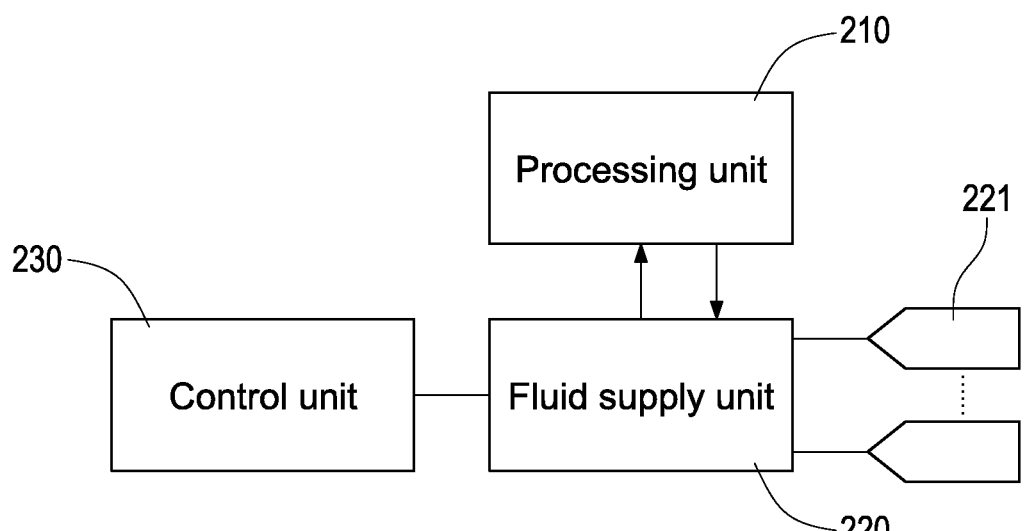
FIG. 2 shows a system block diagram of an apparatus of the present invention.

FIG. 2 shows a schematic view of an apparatus for substrate processing with fluid of the present invention, including a processing unit 210, a fluid supply unit 220, and a control unit 230. The processing unit 210 provides an environment where a substrate (not shown) is processed. The fluid supply unit 220 includes a plurality of containers 221 containing fluids such as chemical, water, air and so on. The fluid supply unit 220 is a device for supplying the fluid from the containers 221 to the processing unit 210 for reacting with the substrate. The reacted fluid in the processing unit 210 can be collected by the fluid supply unit 220. The fluid supply unit 220 is designed to work with the processing unit 210 so that the fluid supplied to the processing unit 210 not only reacts with the substrate, but also provide force to move or rotate the substrate as the process needs. The control unit 230 is a programmable electronic device such as a programmable logic controller (PLC) or a computer workstation, and controls the operations of both the fluid supply unit 220 and the processing unit 210 by inputting parameters required for the processing. The control unit 230 can perform a various kinds of control, such as process control, temperature control, flow volume control, fluid injection and location, and so on.

Figure 3:
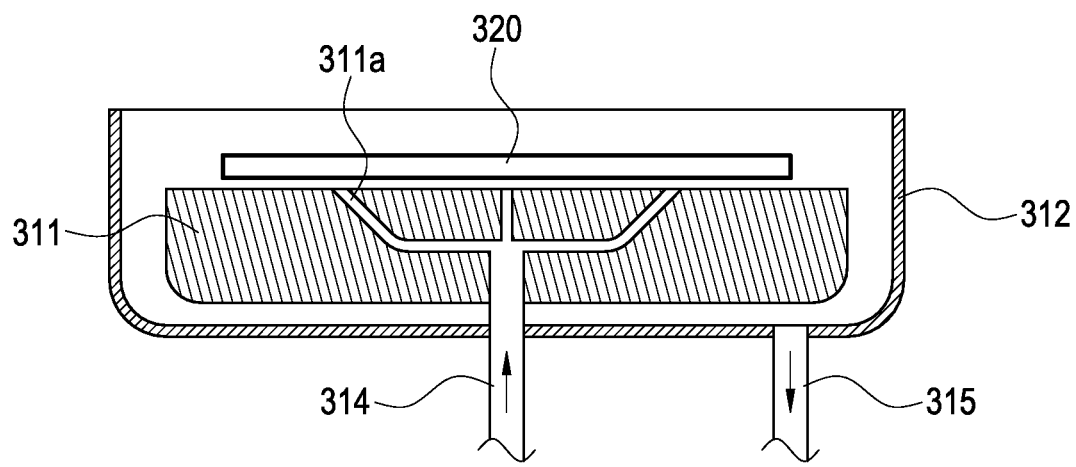
FIG. 3 shows a top cross-sectional view of a processing unit of the present invention.

FIG. 3 shows a cross-sectional view of an embodiment of a processing unit of the present invention. The processing unit includes a platform 311, and a sink 312 arranged below and surround the platform 311. The platform 311 is a platform for laying a substrate 320 during the processing. The platform 311 includes a plurality of injection holes 311a defined on a top surface thereof. The injection holes 311a obliquely and downwardly extend from the top surface of the platform 311 and through a pipe 314 fluid-connected to the fluid supply unit 220 (see FIG. 2). Such that the fluid from the fluid supply unit 220 can be obliquely injected out from the injection holes 311a and slightly floats the substrate 320 over the platform 311. Such that a bottom surface of the substrate 320 can be reacted, cleaned or dried with the fluids. The sink 312 for collecting the fluids reacted and overflowed from the platform 311. The collected fluids are then drained through a pipe 315 back into the fluid supply unit 220 (see FIG. 2) for further processing, re-using or disposing. The substrate 320 can be a flat glass, a silicon wafer, a PCB or other types of equivalent substrates.

Figure 4:
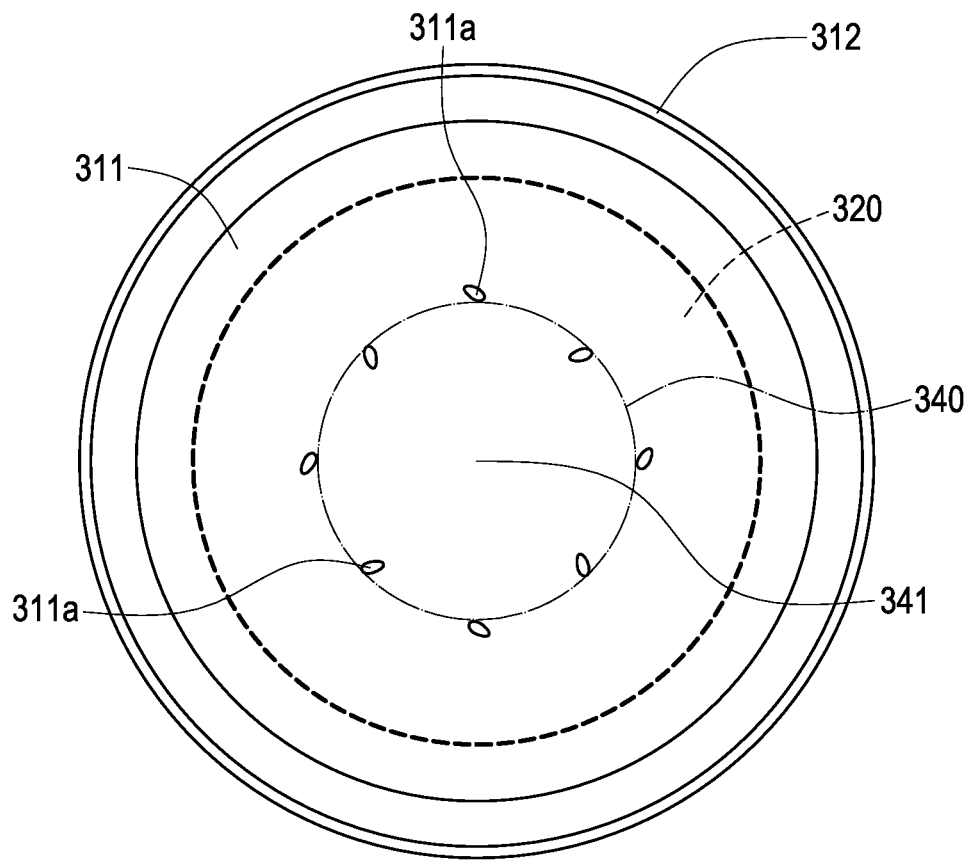
FIG. 4 shows a top view of the processing unit in the FIG. 3.

Besides of carrying out the aforementioned reacting, cleaning or drying process, the fluids obliquely injected out from the injection holes 311a can also be adopted to control the substrate 320 to move over the platform 311. In this embodiment, as FIG. 4 shows, the injection holes 311a have teardrop-shaped openings defined on the top surface of the platform 311 and substantially arranged around an imaginary circle 340. The fluid injection directions of the injection holes 311a are designed to satisfy the following two conditions: the net force exerted on the substrate 320 is zero, but the net torque exerted on the substrate 320 is not zero.

Figure 5:
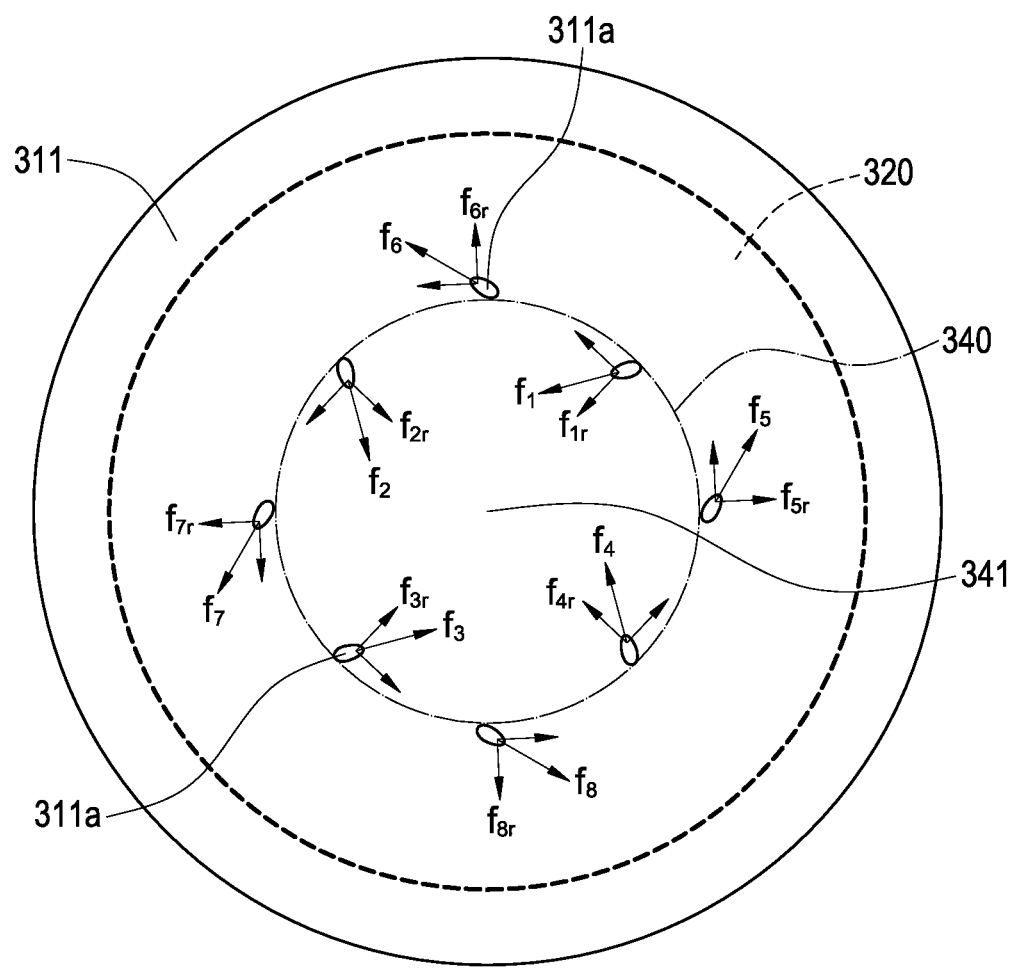
FIG. 5 shows a top view of a plurality of injection holes of the present invention.

In order to meet the abovementioned conditions, as the FIG. 5 shows, there are eight injection holes 311a defined on the platform 311. Each of the injection holes 311a has a predetermined injection direction thereof, which indicates the direction of the force (f1-f8) exerted on the substrate 320 by the fluid injected out from the corresponding injection hole 311a. Each force (f1-f8) has a radial force component (f1$r$-f8$r$) relative to a center 341 of the imaginary circle 340. As a result, a sum of the radial force components f1$r$ to f8$r$ is designed to be zero to meet the abovementioned condition of zero net force exerting on the substrate 320, which the substrate 320 keeps staying at its original position. In another aspect, a non-zero sum of tangent force components of the forces of f1 to f8 results a non-zero torque to rotate the substrate 320.

Further, the thickness of a boundary layer of the fluid adjacent to the substrate 320 can be controlled by adjusting the injection speed of the fluid from the injection holes 311a by a fluid speed control device. When the injection speed of the fluid from the injection holes 311a is increased, the thickness of the boundary layer is decreased, this accelerates the speed of chemical species in the fluid diffusing across the boundary layer to react with the substrate 320.

Figure 6:
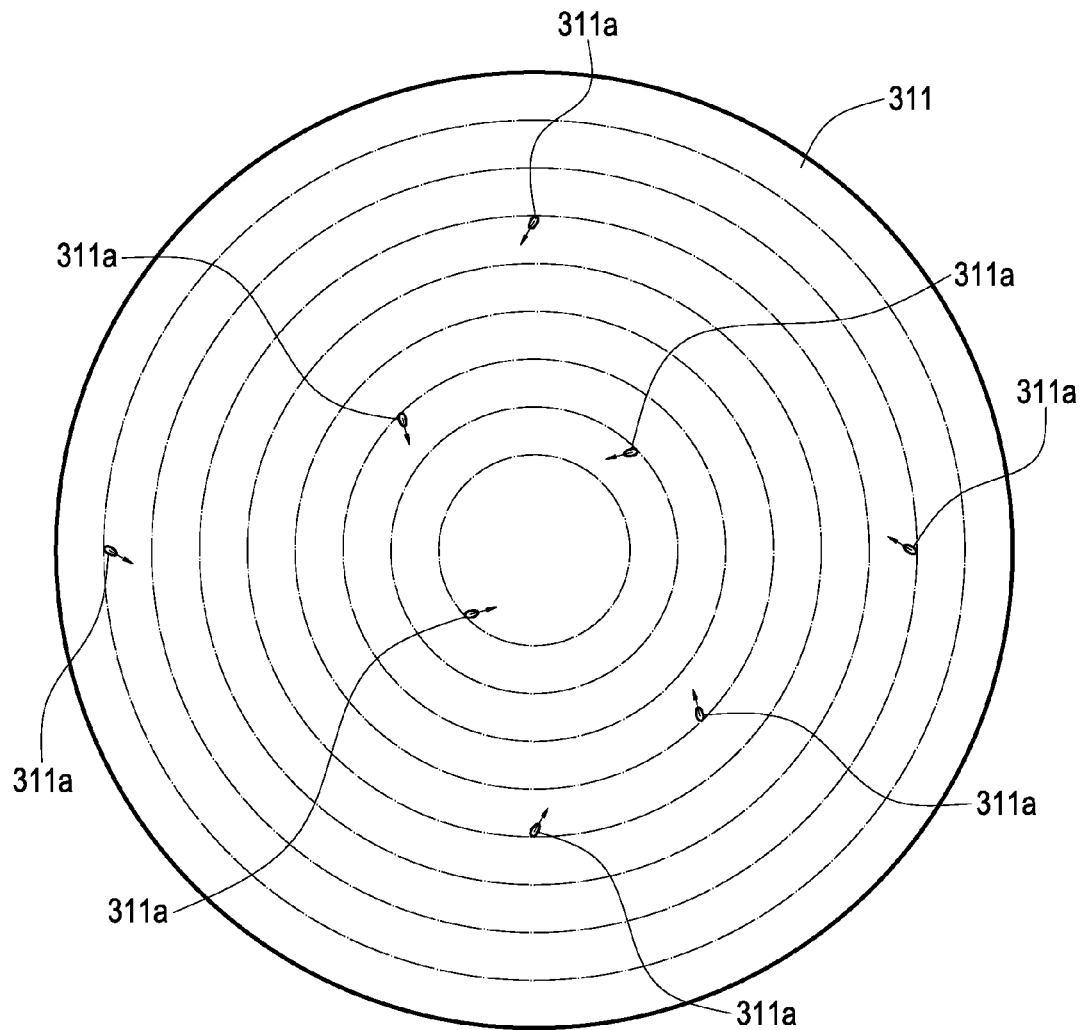
FIG. 6 shows a top view of another arrangement of the injection holes of the present invention.

Besides of the abovementioned arrangement of the injection holes 311a defined on the platform 311, another arrangement of the injection holes 311a is shown in FIG. 6, which the injection holes 311a are arranged in a divergent form instead of around a circle. The divergent form of the injection holes 311a in FIG. 6 is designed in the similar way as the abovementioned, which is required to follow the two conditions: the net force exerted on the substrate 320 is zero, but the net torque exerted on the substrate 320 is not zero.

Figure 7:
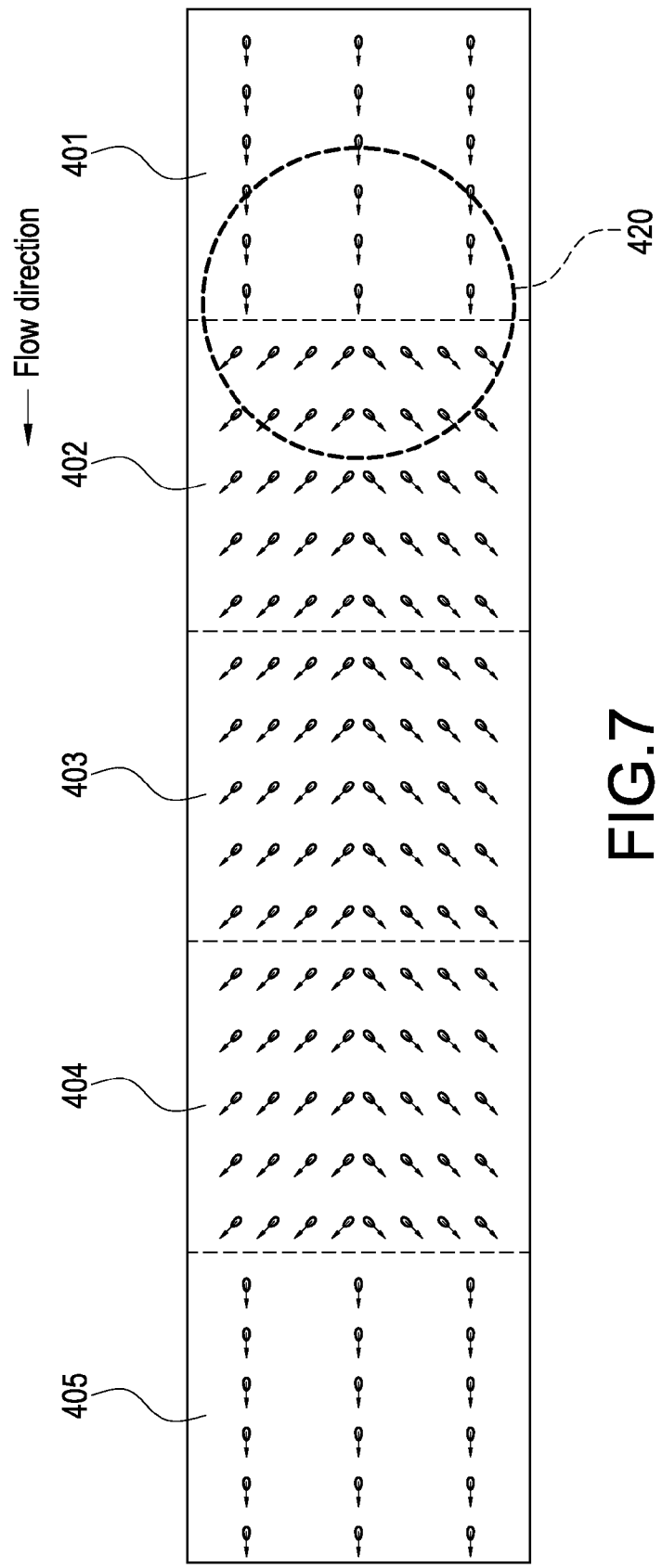
FIG. 7 shows a top view of another embodiment of processing unit of the present invention.

FIG. 7 shows a schematic view of an embodiment of a processing unit with a straight movement similar to a conveyor, including a feed-in platform 401, a chemical process platform 402, a cleaning process platform 403, a drying process platform 404 and an output platform 405. The substrate 420 moves along a predetermined flow direction from the feed-in platform 401, through the chemical process platform 402, the cleaning process platform 403 and the drying process platform 404 to the output platform 405. The substrate 420 can be a flat glass, a silicon wafer, a PCB or other types of equivalent substrates. The injection directions of the injection holes defined on the feed-in platform 401 and the output platform 405 are substantially toward the same predetermined flow direction.

In another aspect, in order to tailor the process duration time of the substrate 420 to meet the process requirement, the injection holes of the chemical process platform 402, the cleaning process platform 403 or the drying process platform 404 can have fluid injection directions symmetrically oblique to the predetermined flow direction of the substrate 420. The symmetrically oblique injection of fluid slows down the speed of the substrate 420 along the predetermined flow direction, and leads to increase the process duration time of the substrate 420.

Figure 8:
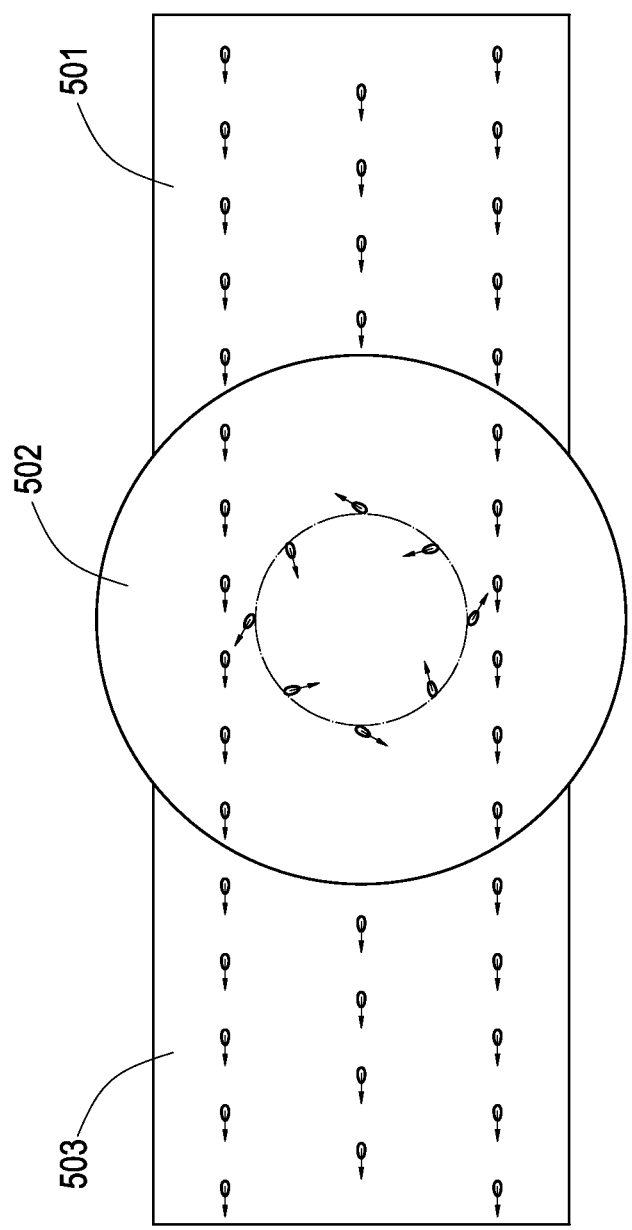
FIG. 8 shows a top view of another embodiment of processing unit of the present invention.

FIG. 8 shows an embodiment of a processing unit with a platform of FIGS. 3 and 4 complemented with two segments of straight conveyor-like movement, including a feed-in platform 501, a platform 502, and an output platform 503. In this embodiment, a substrate (not shown) for processing moves from the feed-in platform 501, through the platform 502, and reaches the output platform 503. The platform 502 provides the environment for various substrate processes, including chemical process, cleaning process and drying process.

Figure 9:
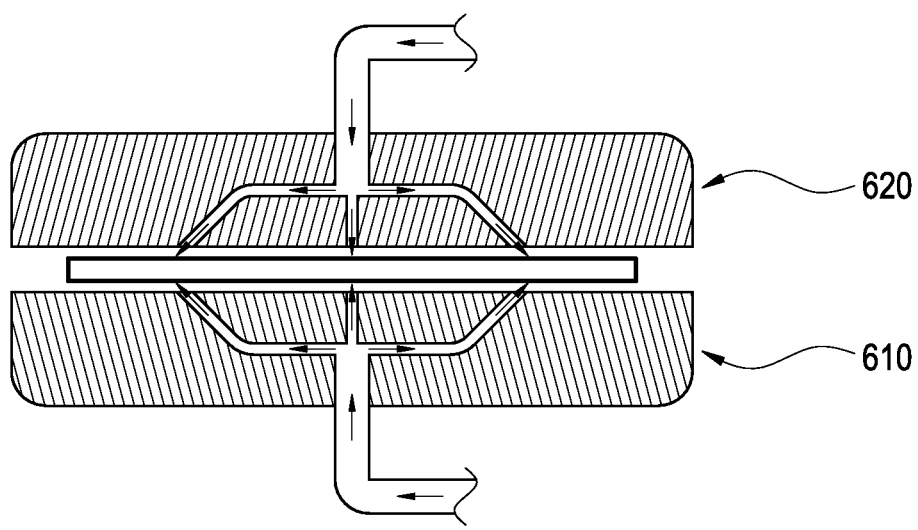
FIG. 9 shows a dual-side processing unit of the present invention.

FIG. 9 shows a schematic view of an embodiment of dual-side processing unit of the present invention, including a bottom processing unit 610 and a top processing unit 620. The bottom processing unit 610 and the top processing unit 620 can have an identical or different design to match the processing requirements. The substrate is sandwiched between the bottom processing unit 610 and the top processing unit 620. In addition, both the bottom processing unit 610 and the top processing unit 620 are connected to the fluid supply unit 220 of FIG. 2 so that the control unit 230 of FIG. 2 can control the operations of both the bottom processing unit 610 and the top processing unit 620. Besides being capable of processing the two opposite faces of the substrate at the same time, this embodiment also has another advantage that the processing time of the substrate can be shortened to improve the production efficiency.

Figure 10:
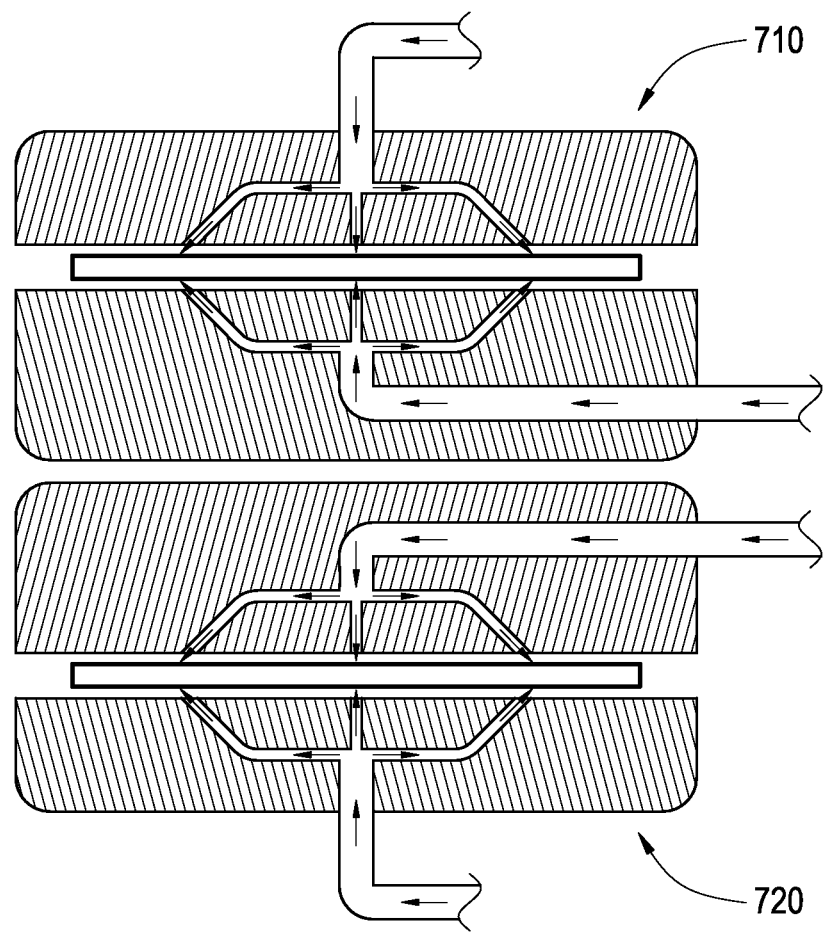
FIG. 10 shows a stacked dual-size processing unit of the present invention.

FIG. 10 shows yet another embodiment of a stacked processing unit of the present invention, including a plurality of dual-side processing units 710, 720 stacked on each other. Without any additional motors and drive mechanisms, this embodiment provides additional benefits of space-saving as well as the improvement of production efficiency.

Figure 11:
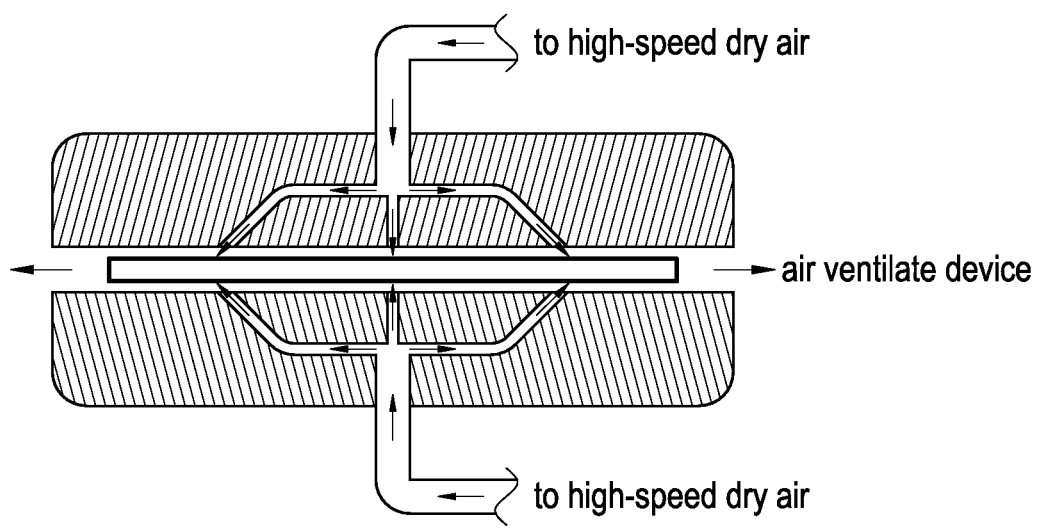
FIG. 11 shows another application of the present invention.

FIG. 11 shows another application of the present invention. In this embodiment, a high pressure dry gas, such as nitrogen, is supplied to the processing unit, and an air ventilation device is included to draw the nitrogen gas from the processing unit. As the high pressure dry gas flowing through the surfaces between the substrate and the rotating platform, the substrate can be quickly dried the two faces thereof without any means to hold thereon the substrate, thus saving cost of the processing unit.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An apparatus for substrate processing, comprising:
a processing unit, including a bottom platform and a top platform, each of the top platform and the bottom platform comprising a plurality of injection holes with teardrop-shaped openings defined on a substrate facing surface, wherein the injection holes obliquely and inwardly extend from the substrate facing surface;
a fluid supply unit, comprising a plurality of containers containing fluids for supplying to the processing unit and fluid-connected to the injection holes of the top platform and the bottom platform; and
a substrate disposed between the top platform and the bottom platform so that when the fluids from the fluid supply unit are injected out from the injection holes of the top platform and the bottom platform to react with the substrate, the substrate is slightly floated and capable of linearly moving with respect to the top platform and the bottom platform by force providing from the fluids.

2. The apparatus in claim 1, wherein fluid injection directions of the injection holes are designed to satisfy net torque exerted on the substrate is not zero so that the substrate is also capable of rotating with respect to the top platform and the bottom platform directly by the force providing from the fluids.

3. The apparatus in claim 2, wherein the injection holes are substantially arranged around an imaginary circle.

4. The apparatus in claim 1, wherein, fluid injection directions of the injection holes are substantially toward a same predetermined direction.

5. The apparatus in claim 1, wherein fluid injection directions of the injection holes are symmetrically oblique to a predetermined direction.

6. The apparatus in claim 1, wherein the fluids are injected onto both sides of the substrate.

7. The apparatus in claim 1, wherein a high speed dry gas can be injected from the fluid supply unit to dry the substrate.

8. The apparatus in claim 1, further comprising a control unit for controlling the operations of both the processing unit and the fluid supply unit.

9. The apparatus in claim 1, wherein the fluid is chemical, water or air.

* * * * *